(12) United States Patent
Inomata

(10) Patent No.: US 6,426,553 B2
(45) Date of Patent: Jul. 30, 2002

(54) TEST SOCKET OF SEMICONDUCTOR DEVICE

(75) Inventor: Tatsuya Inomata, Oita-ken (JP)

(73) Assignee: Kabushiki Kaishia Toshiba, Kawasaki (JP)

( * ) Notice: Subject to any disclaimer, the term of this patent is extended or adjusted under 35 U.S.C. 154(b) by 0 days.

(21) Appl. No.: 09/839,239

(22) Filed: Apr. 23, 2001

(30) Foreign Application Priority Data

Apr. 25, 2000 (JP) .......................................... 2000-124208

(51) Int. Cl.⁷ .............................................. H01L 23/34
(52) U.S. Cl. ........................................................ 257/727
(58) Field of Search ................................ 257/727, 726, 257/780

(56) References Cited

U.S. PATENT DOCUMENTS

| | | | |
|---|---|---|---|
| 5,493,237 A | 2/1996 | Volz et al. | 324/754 |
| 5,693,982 A * | 12/1997 | Ideta et al. | 257/723 |
| 6,120,885 A * | 9/2000 | Call et al. | 428/209 |
| 6,283,780 B1 * | 9/2001 | Yamamoto et al. | 438/266 |
| 6,313,999 B1 * | 11/2001 | Fratti et al. | 361/774 |

* cited by examiner

Primary Examiner—David Nelms
Assistant Examiner—Quoc Hoang
(74) Attorney, Agent, or Firm—Finnegan, Henderson, Farabow, Garrett & Dunner, L.L.P.

(57) ABSTRACT

A test socket for a semiconductor device is provided having a contact member 30, which lies between the external terminals 25, projected from the package 24 of the IC 22 and the contact pads 26 of the test board 23 for making them in conductive with each other. The contact member 30 is made of a metallic contact member 29, which is in contact with the external terminals 25 through blades 32 and a conductive elastic contactor 28. The conductive elastic contactor 28 has an upper contact part 28a and a lower contact part 28b, which are projected from the top and bottom surfaces of the insulating base 27. The lower contact part 28b is in contact with the contact pads 26 of the test board 23.

16 Claims, 7 Drawing Sheets

TEST SOCKET OF SEMICONDUCTOR DEVICE

BACKGROUND OF THE INVENTION

The present invention relates to a test socket of a semiconductor device to be used, for example, to connect a semiconductor package having a ball-shaped external terminal projected from the package bottom to test equipment.

A conventional test socket of a semiconductor device will be explained by referring to FIGS. 1 to 3.

Firstly, the first prior art will be explained referring to FIG. 1. FIG. 1 is a cross sectional view showing a basic constitution of a contact member 1 of a spring probe pin type test socket. The spring probe pin type test socket is a test socket for executing a characteristic evaluation test of, for example, an FBGA (flat package ball grid array) IC (integrated circuit) 2 in which many contact members 1 are installed in the test socket. Each of these contact members 1 is structured so as to receive a ball-shaped external terminal 3 made of solder projecting from a bottom of a package of IC 2 with a concavity at an upper end thereof being supported by a pin support member not shown in the drawing. The lower end thereof is in contact with a contact pad 5 of a test board 4 corresponding to the external terminal 3 of the IC 2. External terminal 3 and pad 5 are thus connected to be conductible to each other, thereby DC characteristic evaluation or AC characteristic evaluation such as the high frequency characteristics and high-speed characteristics are carried out.

The contact member 1 has a metallic cylindrical case 6 with an upper end closed, a compression spring 7 housed in the case 6 for generating compression force in the axial direction, and a contact end 8 projecting downward from a lower end opening of the case 6. An upper end of the contact end 8 is connected to a metallic plunger 9, which is compressed by the spring 7 in the cylindrical case 6. Furthermore, at the upper end of the case 6, a concavity 10 is formed. The characteristic evaluation test of the IC 2 is executed under the condition that the external terminal 3 on the bottom of the IC 2 is pressed against the upper end concavity 10 of the contact member 1 installed to the test socket and that the contact end 8 of the plunger 9 projected downward is pressed against the contact pad 5 of the test board 4 of the test equipment at the same time.

However, the contact member 1 of the spring probe pin type test socket has a line length of, for example, 3 to 5 mm and has an inductance of 1 nH to 1.5 nH or so due to the structure in which the upper end concavity 10 and the contact end 8 are respectively pressed against the corresponding external terminal 3 and contact pad 5 so as to conduct to each other by the plunger 9 compressed by the spring 7 housed in the case 6 and connected. As a result, at the time of evaluation of the characteristics at a frequency of several GHz, the line length must be shorter. However, due to the structure of the spring probe pin type test socket, it is difficult to shorten the line length. Thus, a test socket for high frequency having a short line length and low inductance must be used which means a replacement of the test socket.

Next, the second prior art will be explained referring to FIG. 2. FIG. 2 is a cross sectional view showing a basic structure of a contact member 11 of a sheet type test socket. In FIG. 2, the contact member 11 is a test socket for executing the characteristic evaluation test of the IC 2 of the FBGA type described above, which is structured so that many metallic wires 13 are embedded overall a sheet-like insulating base 12 at a fine pitch and are inclined to a surface of the sheet.

At the time of conducting the DC characteristic evaluation or the AC characteristic evaluation such as the high frequency characteristics and high-speed characteristics, the contact member 11 of the test socket is arranged between the IC 2 and the test board 4 of the test equipment. The external terminal 3 of the IC 2 and the corresponding contact pad 5 of the test board 4 are arranged facing to each other across the contact member 11. Thereafter, the external terminal 3 and the contact pad 5 are pressed against the contact member 11. With the arrangement, a part of the wires 13 obliquely embedded in the insulating base 12 and in contact with the external terminal 3 are also in contact with the contact pad 5 and thereby being made conductive to each other.

In the contact member 11 of the test socket having the structure described, the length of the oblique metallic wires 13, that is, the line length is about 1.1 mm when the thickness of the insulating base 12 is about 1 mm, for example, which is shorter than that of the first prior art and the inductance is 0.2 nH or less, which is also lower than that of the first prior art. As a result, characteristics at a frequency of several GHz can be evaluated.

However, in the test socket of the second prior art, solder dust or package dust adhered on the surface of the external terminal 3 is also adhered on the surface of the contact member 11 in contact with the external terminal 3 of the IC 2 when the IC 2 characteristic evaluation test is executed many times. When the characteristic evaluation test is continued further, the adhered dust remained and piled increases contamination, which impedes a result of the characteristic evaluation test. Therefore, whenever the contact count reaches about 1500 times, for example, the contact member 11 must be frequently cleaned for which a great deal of time is required.

In the test socket, on the other hand, the cost is very high due to the structure of the contact member 11 in which the metallic wires 13 are arranged regularly overall the insulating base 12.

Next, the third prior art will be explained referring to FIG. 3. FIG. 3 is a cross sectional view showing the basic structure of a contact member 14 of a sheet type test socket for executing the characteristic evaluation test of the IC 2 of FBGA described above. The contact member 14 holds many conductive elastic contactors 16 at a position corresponding to the external terminal 3 on the bottom of the package of IC 2 of the sheet-like insulating base 15. Each of the elastic contactors 16 is formed passing through the insulating base 15 and having an upper contact part 16a and a lower contact part 16b respectively projected from an upper and a lower surface of the insulating base 15.

At the time of conducting the DC characteristic evaluation and the AC characteristic evaluation such as the high frequency characteristics and high speed characteristics, the contact member 14 of the test socket is arranged between the IC 2, so that the test board 4 of the test equipment and the contact surface of the lower contact part 16b of the elastic contactor 16 is positioned right above the contact pad 5 of the test board 4. Further, the corresponding the external terminal 3 of the IC 2 is positioned right above the contact surface of the upper contact part 16a of the elastic contactor 16. Thereafter, the external terminal 3 is pressed against the contact surface of the upper contact part 16a of the elastic contactor 16 installed on the contact member 14 and the contact surface of the lower contact part 16b of the elastic contactors 16 is pressed against the top of the contact pad 5 of the test board 4. With the arrangement, the external terminal 3 and the contact pad 5 are made conductive to each other via the elastic contactor 16.

When the total height of the elastic contactor 16 held by the insulating base 15, that is, the line length is selected as about 0.7 mm, for example, in the contact member 14 of the test socket having the structure described, it is shorter than that of the second prior art having such a low inductance as 1.0 nH. As a result, characteristics at a higher frequency than that of the second prior art can be evaluated.

However, in the test socket described, as well as in the second prior art, solder dust or package dust adhered on the surface of the external terminal 3 is also adhered on the surface of the elastic contactor 16 of the contact member 14 in contact with the external terminal 3 of the IC when the IC 2 characteristic evaluation test is executed many times. When the characteristic evaluation test is continued further, the adhered dust remained and piled increases contamination, which impedes a result of the characteristic evaluation test. Therefore, whenever the contact count reaches about 1500 times, for example, the contact member 14 must be frequently cleaned for which a great deal of time is required.

The present invention was made under the circumstance described above and has an object to provide a test socket for a semiconductor device which enables the high frequency characteristics evaluation satisfactorily, requires shorter time for cleaning and is easy to handle.

BRIEF SUMMARY OF THE INVENTION

The test socket for a semiconductor device according to the present invention having contact members which lie between ball-shaped external terminals projected from a surface of the semiconductor device and contact pads of the semiconductor test circuit to make them conductive to each other wherein each of said contact member comprises blade-shaped contact members in contact with one of said external terminals, a positioning member for positioning said blade-shaped contact members having positioning holes into which said blade-shaped contact members are inserted, and a conductive elastic contactor having a top portion which is in contact with said blade-shaped contact member positioned by said positioning member and a bottom portion of which is in contact with one of said contact pads.

Further, in the test socket for a semiconductor device according to the present invention, the blade-shaped contact members have a plurality of blades arranged so that their outer surfaces form a circular surface and that ridgelines of the blades become gradually low from the outer peripheral surfaces of the circular arrangement toward the center thereof and intersect each other at a bottom part.

Furthermore, in the test socket of a semiconductor device according to the present invention, the blade-shaped contact member has a flange formed at its bottom which engages a lower surface of the positioning member and prevents the blade-shaped contact member from being get out of the positioning holes upward, when they are inserted into the positioning holes of the positioning members.

Furthermore, in the test socket for a semiconductor device of the present invention, the blade-shaped contact member has a substantially flat bottom surface, which is in contact with a top of the elastic contactors.

Furthermore, in the test socket for a semiconductor device according to the present invention, the blade-shaped contact members are installed so as to be removable from the elastic contactors.

Furthermore, in the test socket for a semiconductor device according to the present invention, the elastic contactors are made of a conductive resin and are embedded in an insulating base at a predetermined pitch.

Furthermore, in the test socket for a semiconductor device according to the present invention, the insulating base supports the elastic contactors so that both ends thereof are projected from upper and lower surfaces of the insulating base.

Furthermore, in the test socket for a semiconductor device according to the present invention, either one of the bottom of the blade-shaped contact member and the top of the elastic contactor has either one of a convexity and concavity so that they are fit into each other.

Furthermore, in the test socket for a semiconductor device according to the present invention, the positioning members having the positioning openings position the contact members and elastic contactors for the external terminals and contact pads.

Further, the test socket for a semiconductor device according to the present invention having contact members which lie between a plurality of ball-shaped external terminals projected from a surface of the semiconductor device and contact pads of the semiconductor test circuit to make them conductive to each other wherein each of said contact member comprises a blade-shaped contact members in contact with one of said external terminals, a positioning member for holding the blade-shaped contact members, and a plurality of conductive elastic contactors having a top portion which is in contact with one of said blade-shaped contact members positioned by said positioning member and a bottom portion of which is in contact with one of said contact pads.

Further, in the test socket for a semiconductor device according to the present invention, the blade-shaped contact members have a plurality of blades arranged so that their outer surfaces form a circular surface and that ridgelines of the blades become gradually low from the outer peripheral surfaces of the circular arrangement toward the center thereof and intersect each other at a bottom part.

Furthermore, in the test socket for a semiconductor device according to the present invention, a plurality of positioning holes are formed in the positioning members and the blade-shaped contact member has a flange formed at its bottom which engages a lower surface of the positioning member and prevents the blade-shaped contact member from being get out of the positioning holes upward, when they are inserted into the positioning holes of the positioning members.

Furthermore, in the test socket of the semiconductor device of the present invention, the blade-shaped contact member has a substantially flat bottom surface, which is in contact with a top of the elastic contactors.

Furthermore, in the test socket for a semiconductor device according to the present invention, the elastic contactors are made of a conductive resin and are embedded in an insulating base at a predetermined pitch.

The test socket for a semiconductor device according to the present invention comprises a frame plate having a space for housing the semiconductor device at a center portion thereof, a positioning member in contact with a bottom surface of the frame plate which is arranged so that a part of an upper surface thereof is exposed in the space for housing the semiconductor device, a plurality of blade-shaped contact members fixedly received in a plurality of positioning holes formed in the positioning member, an insulating base arranged so as to be in contact with a bottom surface of the positioning member, a plurality of elastic contactors embedded in an insulating base at a predetermined pitch, and a board arranged in contact with a bottom surface of the insulating base on which the semiconductor test circuit is formed.

Furthermore, in the test socket for a semiconductor device according to the present invention, positioning pins are fixed to the frame plate penetrating through the positioning member, insulating base, and the board on which the semiconductor test circuit are formed.

DETAILED DESCRIPTION OF THE INVENTION

The embodiments of the present invention will be explained hereunder with reference to the accompanying drawings.

Figure 1:
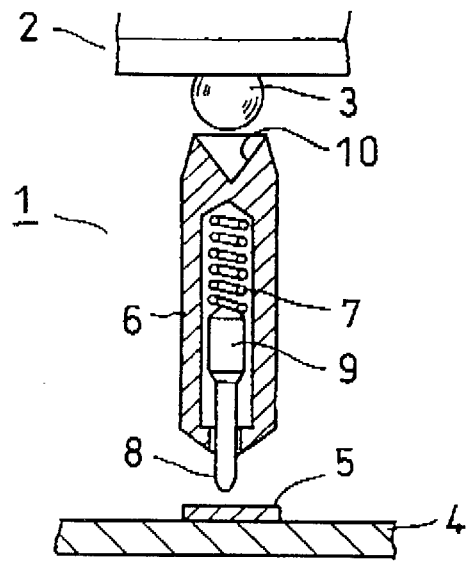
FIG. 1 is a cross sectional view showing the basic structure of a conventional test socket for a semiconductor device.
Figure 2:
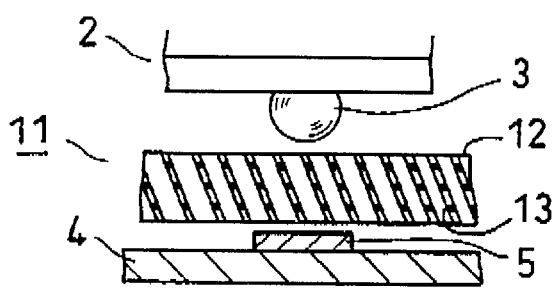
FIG. 2 is a cross sectional view showing the basic structure of a conventional test socket for a semiconductor device.
Figure 3:
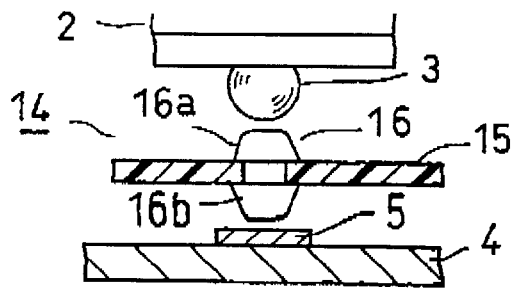
FIG. 3 is a cross sectional view showing the basic structure of a conventional test socket for a conventional semiconductor device.
Figure 4:
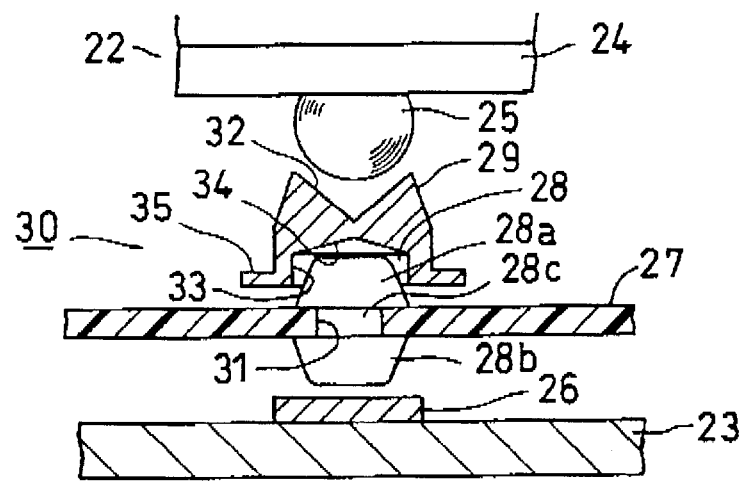
FIG. 4 is a cross sectional view showing the basic structure of the test socket for a semiconductor device according to a first embodiment of the present invention.
Figure 5:
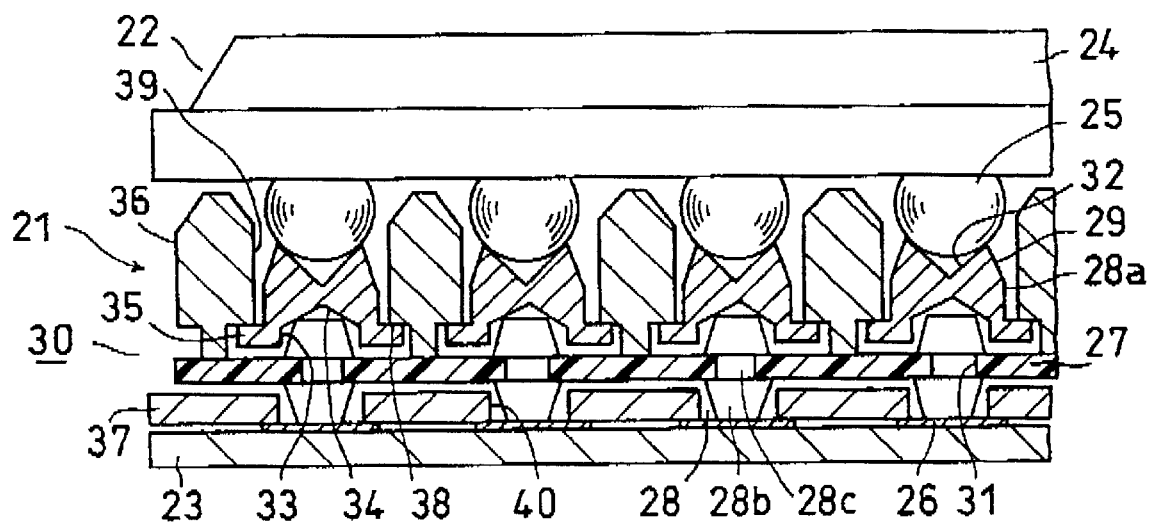
FIG. 5 is a partial cross sectional view of the test socket for a semiconductor device according to the first embodiment of the present invention.
Figure 6:
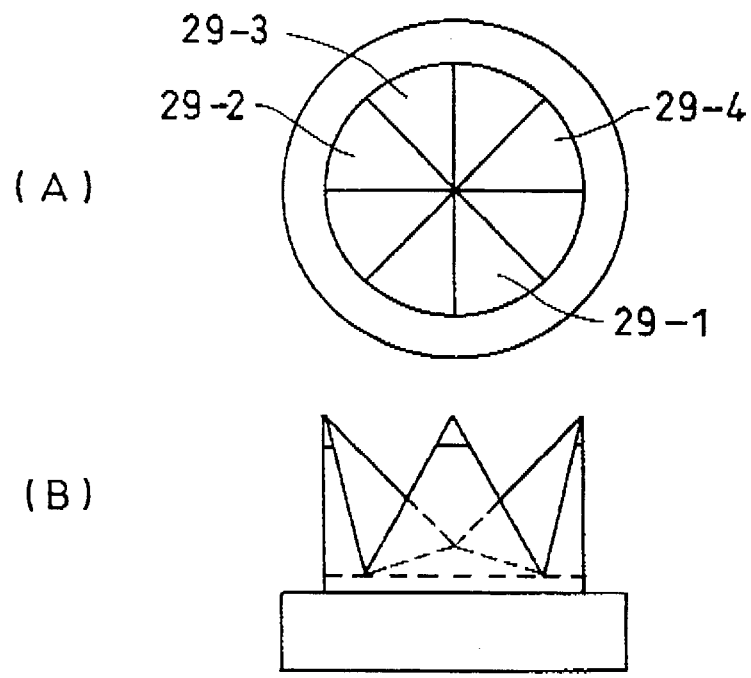
FIG. 6 is an enlarged view of the essential section of the test socket for a semiconductor device according to the present invention.
Figure 7:
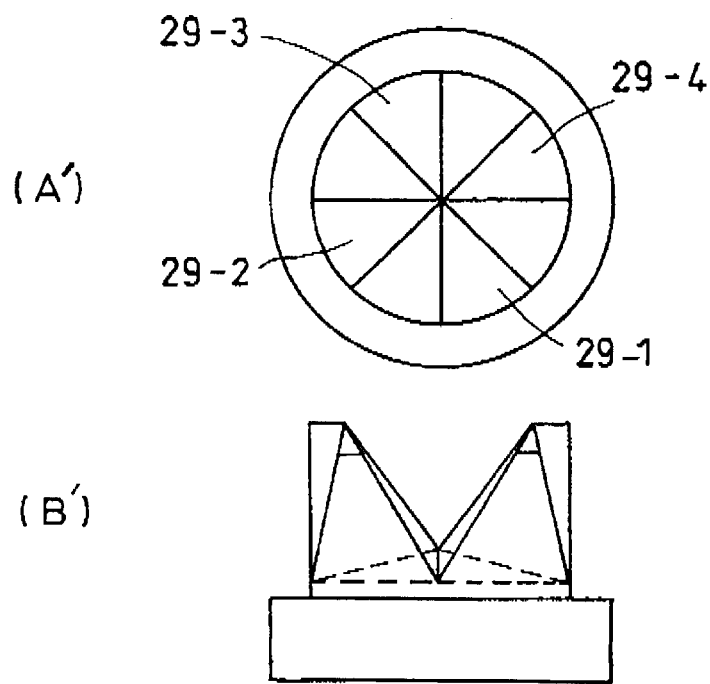
FIG. 7 is an enlarged view of the essential section of the test socket for a semiconductor device according to the present invention.

The first embodiment will be explained by referring to FIGS. 4 to 7. FIG. 4 is a cross sectional view showing the basic structure of the test socket of the semiconductor device according to the present invention and FIG. 5 is a cross sectional view showing the essential section thereof. FIGS. 6 and 7 are enlarged views of a part of FIG. 4.

In FIGS. 4 and 5, a test socket 21 is a test socket for executing a characteristic evaluation test of an IC (integrated circuit) 22 of a FBGA (flat package ball array). The test socket 21 is attached to the IC 22 and then mounted to a test board 23 of the test equipment, thereby the test for characteristic evaluation is executed. On the IC 22 to be tested, a plurality of external terminals 25 made of ball-shaped solder is projected at a predetermined pitch on the bottom of a package 24. On the test board 23 of the test equipment, gold-plated contact pads 26 made of a copper material are mounted corresponding to the external terminals 25 of the IC 22 at a predetermined pitch.

On the other hand, the test socket 21 has a contact member 30 having an elastic contactor 28 mounted on a sheet-like. An upper contact part 28a and a lower contact part 28b of the elastic contactor 28 are projected from the top and bottom surfaces of the insulating base 27. A metallic blade-shaped contact member 29 is provided in a removable state so as to cover the upper contact part 28a of the elastic contactor 28. The contact member 30, thus formed, is provided lying between the external terminates 25 of the IC 22 and the contact pads 26 of the test boards 23, so that the corresponding external terminals and the contact pads are made conducted to each other.

FIG. 6 is a drawing showing the structure of a blade-shaped contact member 29, and (A) is a top view, and (B) is a side view. FIG. 7 is also a drawing showing the structure of the blade-shaped contact member 29, though it is a drawing viewed at a different angle from that shown in FIG. 6. As shown in these drawings, the blade-shaped contact member 29 has four contact blades 29-1, 29-2, 29-3, and 29-4, each of which forms an arc outer peripheral surface in the top view. The four contact blades 29-1, 29-2, 29-3, and 29-4 are arranged so that the whole outer thereof are almost circular as shown in the top view (A). Inside the circular peripheral surfaces, ridges of the blades 29-1, 29-2, 29-3, and 29-4 descend by a gradual slope from the circular outer peripheral surface toward a center portion thereof and intersect each other at the center portion. The blade-shaped contact member 29 is made of, for example, beryllium copper having a gold-plated surface. An upper end of the contact member 29 is in contact with the surface of the ball-shaped external terminals 25 of the IC 22 via the ridges of the contact blades 29-1, 29-2, 29-3, and 29-4, and thus one of the contact members 29 and the corresponding external terminal 25 are made conductive to each other. The blade-shaped contact members 29 were explained as each having four contact blades 29-1, 29-2, 29-3, and 29-4. However, the number of contact blades is not limited to 4 and may be any number more than one.

The insulating base 27 included in the contact member 30, as shown in FIGS. 4 and 5, is made of, for example, a polyimide resin film, which allows little deformation in size and has a high heat resistance. In the insulating base 27, mounting holes 31 for mounting the elastic contactors 28 are formed at positions corresponding to the locations of the external terminals 25 of the IC 22.

Furthermore, the elastic contactor 28 is made of, for example, synthetic rubber such as conductive silicone rubber, natural rubber, or flexible synthetic resin with carbon, metallic powder, or metal filler mixed. An upper contact part 28a and a lower contact part 28b having a shape of truncated cone the diameter of which is larger than that of a mounting hole 31 are formed on both end sides of the elastic contactor 28. An intermediate part 28c of the elastic contactor 28 is inserted in the mounting hole 31, thereby fixing the elastic contactor 28 to the insulating base 27.

On the other hand, a concavity 33 with a larger diameter than that of the upper contact part 28a of the elastic contactor 28 is formed at the end of the blade-shaped contact member 29 on the side of the test board 23. A conic concavity 34 is further formed in the concavity 33. A flange 35 is provided extending outward at the end of the blade-shaped contact member 29 on the side of the test board 23. When the contact member 29 covers the upper contact part 28a of the elastic contractor 28, the conic surface of the concavity 34 of in the concavity 33 is in contact with the edge of the upper contact part 28a. When the contact member 29 is pressed at the time of the test, the upper contact part 28a begins to deform thereby making the contact member 29 and the elastic contactor 28 in conductive to each other.

The test socket 21 has an upper positioning member 36 and a lower positioning member 37 with a predetermined thickness and predetermined hardness for supporting and positioning the contact member 30 at the time of test. The upper positioning member 36 and the lower positioning member 37 are made of such an insulating material as a synthetic resin including epoxy resin filled with glass filler, PAI (polyamide-imide), or PES (polyether sulfide), for example.

The upper positioning member 36 is placed on the insulating base 27 to position the contact member 29 as well as to support the IC 22 at the time of test. The upper positioning member 36 has a plurality of upper positioning holes 39 in which the blade-shaped contact members 29 are inserted. A step portion 38 is formed on the lower sidewall of the upper positioning holes 39 to form a lower part with a large diameter. The upper positioning hole 39 positions the contact member 29 in the transverse direction and engages the flange 35 of the blade-shaped contact member 29 with the step portion 38 so as to prevent it from getting out of the upper positioning hole 39.

The thickness of the upper positioning member 36 is appropriately selected within a range of elastic deformation of the upper contact part 28a of the elastic contactor 28, so that even when the upper contact part 28a is deformed until the external terminal 25 is brought in contact with the four blades of the blade-shaped contact member 29 by pressing the IC 22 downward, and the bottom of the package 24 of the IC 22 touches the top of the upper positioning member 36, a pressure for making a contact between the external terminal 25 and the four blades of the blade-shaped contact member 29 is set to a required value.

On the other hand, the lower positioning contactor 37 positions the elastic contactor 28 placed on the contact pad 26 of the test board 23 as well as supports the insulating base 27, the upper positioning member 36 and the IC 22, which are placed on it at the time of test. Lower positioning holes 40 are formed in the lower positioning contactor 37 in which the lower contact parts 28b of the elastic contactor 28 are inserted. The lower positioning holes 40 position the lower contact parts 28b of the elastic contactors 28 in the transverse direction, thereby controlling the position of the insulating base 27 to which the elastic contactor 28 is mounted in the transverse direction. The thickness of the lower positioning member 37 is appropriately selected within the range of the elastic deformation of the lower contact part 28b of the elastic contactor 28, thereby making the pressing force between the elastic contactor 28 and the contact pad 26 is set to a required value.

At the time of the characteristic evaluation test of the IC 22 with the test socket thus formed, the contact member 30 in which the upper contact parts 28a of the elastic contactor 28 mounted on the insulating base 27 are covered respectively by the contact members 29 is combined with the lower positioning member 37 by inserting the lower contact parts 28b into the corresponding lower positioning holes 40. The contact members 29 are then inserted into the corresponding upper positioning holes 39, and the upper positioning members 36 are located on the insulating base 27 so that the step portion 38 is put on the flange 35, thereby constructing the test socket 21.

The IC 22 is set in the test socket 21 so that the external terminals 25 are in contact with the concavities 32 of the contact members 29 in the corresponding upper positioning holes 39. Then, the test socket 21 is put on the test board 2 of the test equipment, and the IC 22 set in the test socket 21 is compressed by a compression mechanism of the test equipment, which is not shown in the drawing. The upper contact parts 28a are deformed until the bottom of the package 24 of the IC 22 touches the top of the upper positioning members 36. The lower contact parts 28b is elastically deformed until the insulating base 27 touches the top of the lower positioning members 37 and the height of the lower contact parts 28b of the elastic contactors 28 reaches the thickness of the lower positioning members 37.

The bottom of the lower contact parts 28b is thus in contact with the contact pads 26 of the test board 23 with predetermined compression force and the external terminals 25 of the IC 22 are made conductive to the corresponding contact pads 26 of the test board 23. With the structure described above, the line length of the test socket 21 becomes, for example, 1 mm or less and the inductance becomes 0.5 nH or less.

According to the present embodiment explained above, the line length of the test socket 21 can be shortened and the inductance can be lowered to less than 0.5 nH, so that the characteristics at a high frequency of several GHz can be evaluated. The blade-shaped contact members 29 are pressed to the ball-shaped external terminals 25 of the IC 22 with a long contact length of blades of the blade-shaped contact members 29 with little contact resistance.

Furthermore, the contact members 29 are in contact with the external terminals 25 via a metallic blades, so that the contact members 29 are hardly affected by, for example, solder dust or package dust attached to the surface of the external terminals 25 and the characteristic evaluation test can be executed in a comparatively satisfactory state. Even when the characteristic evaluation test is continued further, the problems in the prior art is resolved that the adhered dust is remained and piled increases contamination, which impedes a result of the characteristic evaluation test. Therefore, the necessity of cleaning is reduced remarkably, and a great deal of time for cleaning is not required.

In the embodiment described above, the ends of the contact members 29 on the side of the IC 22 are of the blade-shaped shape so as to make the contact length of the external terminals 25 with the contact members 29 longer. However, a pin shape may be applied so as to scratch the surface of the external terminals 25 and to realize a sure contact.

Furthermore, the shape of the compressing structure between the contact members 29 and the elastic contactors 28 may be modified. In the embodiment described, the inner bottoms of the concavities of the contact members 29 are conic concavities 34 to make the stroke length at the contact portions of the upper contact parts 28*a* longer. However, the inner bottoms of the concavities of the contact members 29 may be concavities having a curved surface such a spherical surface and furthermore, they may be conic projections or projections having a curved surface such a spherical surface.

Figure 8:
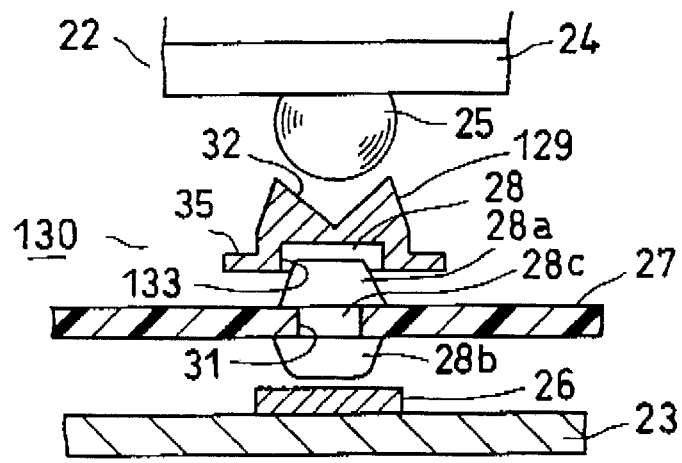
FIG. 8 is a cross sectional view showing a modified example of the test socket for a semiconductor device according to the first embodiment of the present invention.
Figure 9:
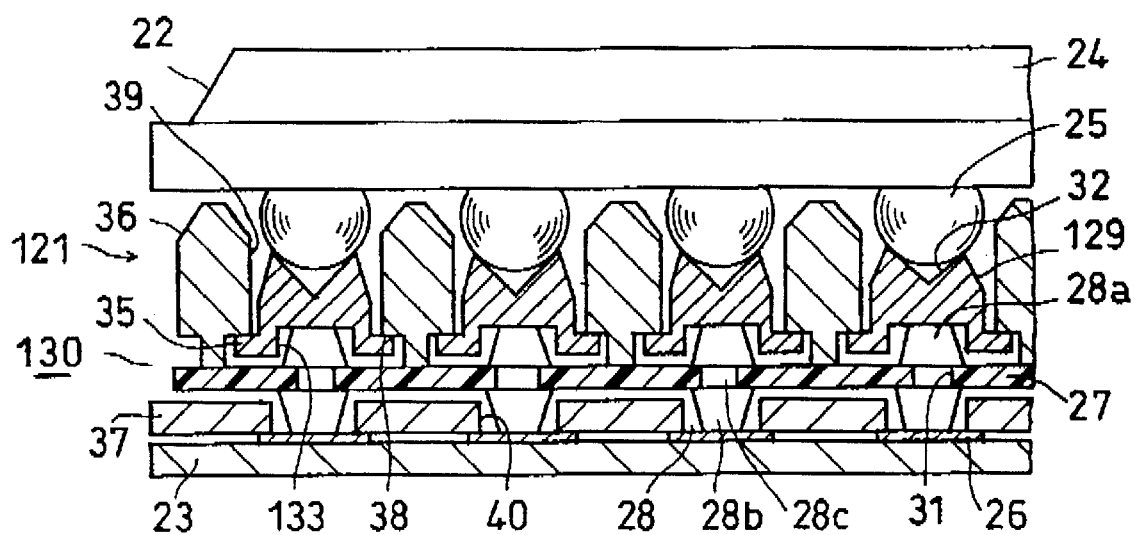
FIG. 9 is a partial cross sectional view showing a modified example of the test socket for a semiconductor device according to the first embodiment of the present invention.

Inversely, to make the stroke length at the contact portions of the contact members 29 and the upper contacts parts 28*a* of the elastic contactors 28 shorter, the concavities may be deformed as shown in FIGS. 8 and 9. Namely, the inner bottoms of concavities 133 of contact members 129 are a flat surface. The flat upper end surfaces of the upper contact parts 28*a* of the elastic contactors 28 are in contact with the inner bottoms of the concavities 133, and the elastic deformation amount of the upper contact parts 28*a* is reduced under the same compression force, and thus the stroke length can be shortened. Even in the deformed structure thus formed, the same effect as that of the first embodiment can be obtained.

Figure 10:
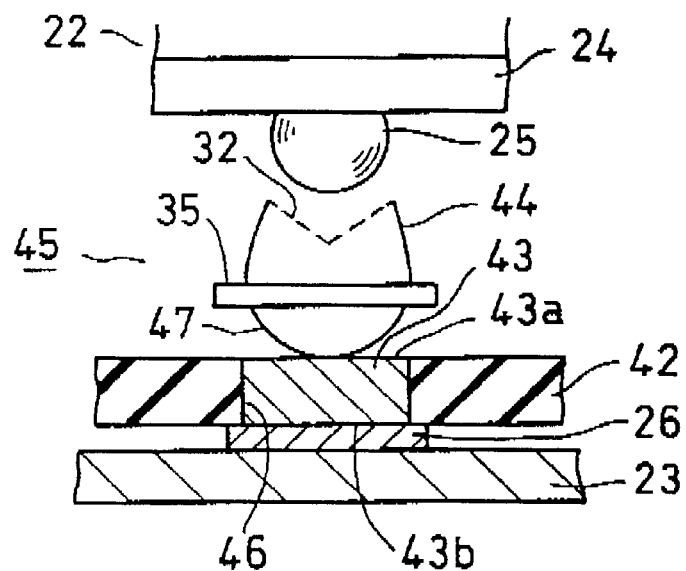
FIG. 10 is a cross sectional view showing the basic structure of the test socket for a semiconductor device according to a second embodiment of the present invention.
Figure 11:
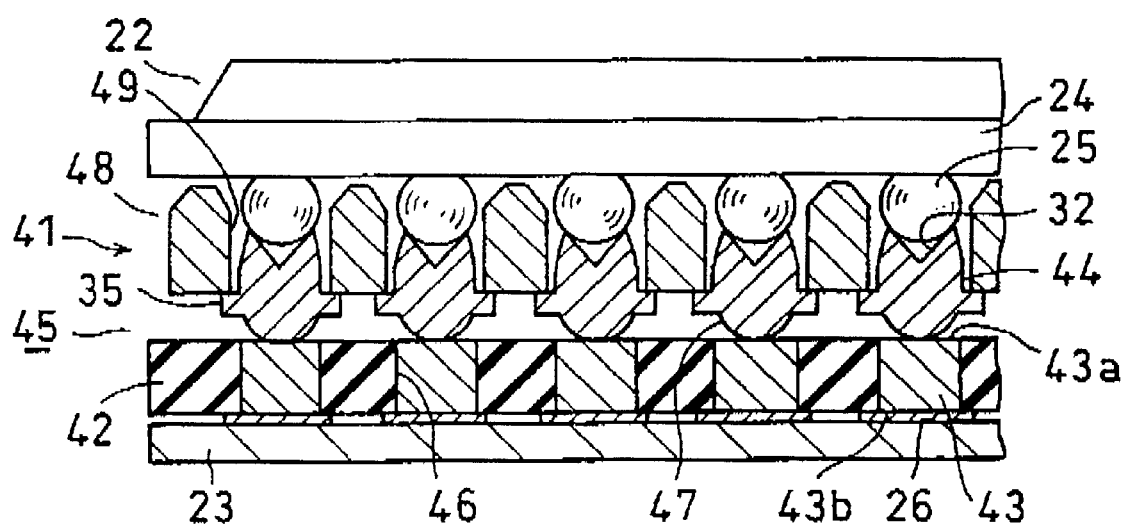
FIG. 11 is a cross sectional view showing a part of the test socket for a semiconductor device according to the second embodiment of the present invention.
Figure 12:
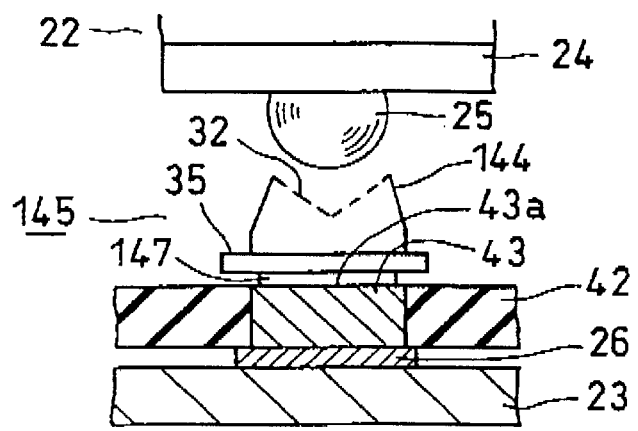
FIG. 12 is a cross sectional view showing a modified example of the test socket for a semiconductor device according to the second embodiment of the present invention.
Figure 13:
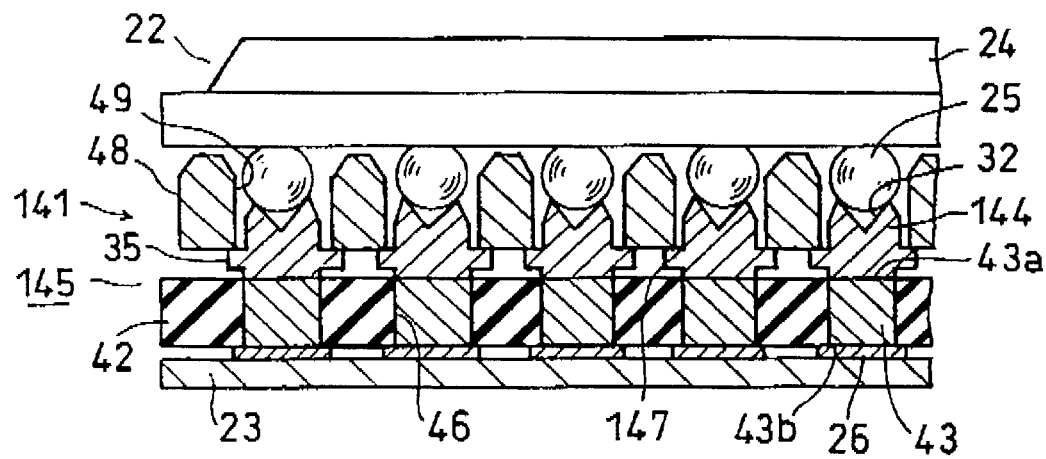
FIG. 13 is a partial cross sectional view showing a modified example of the test socket for a semiconductor device according to the second embodiment of the present invention.

Next, the second embodiment of the present invention will be described referring to FIGS. 10 to 13. FIG. 10 is a cross sectional view showing a basic structure of the test socket for a semiconductor device according to the present invention and FIG. 11 is a cross sectional view of an partial section thereof. FIG. 12 shows a structure shown in FIGS. 10 and 11, which is slightly deformed. The same numeral is assigned to each of the same parts as those in the first embodiment, and the explanation thereof is omitted. The parts of the embodiment different from those of the first embodiment will be explained bellow.

In FIGS. 10 to 13, a test socket 41 is used to mount the IC 22 on the test board 23 and evaluate the characteristics thereof. In the test socket 41, elastic contactors 43 are berried in an elastic laminar insulating base 42 so that upper contact end faces 43*a* and lower contact end faces 43*b* are exposed on the top and bottom surfaces of the elastic laminar insulating base 42. In the test socket 41, metallic blade-shaped contact members 44 in contact with the upper contact end faces 43*a* of the elastic contactors 43 are mounted in a removable state and the elastic contactors 43 and the blade-shaped contact members 44 constitute a contact member 45. The contact member 45 lies between the external terminals 25 of the IC 22 and the contact pads 26 of the test board 23, thereby making them in conductive to each other.

Further, the insulating base 42 and the elastic contactors 43 of the contact member 45 are of pillar-like shape and are made of, for example, synthetic rubber such as silicone rubber, or natural rubber, or flexible synthetic resin, which are made conductive by being mixed with, for example, carbon, metallic powder, or metal filler. The elastic contactors 43 are fit into holes 46 formed in the corresponding portions to the external terminals 25 of the IC 22 of the insulating base 42 and integrated with the insulating base 42 and the elastic contactors 43 and the insulating base 42 form a so-called zebra connector.

The blade-shaped contact members 44 are made of, for example, beryllium copper having a gold-plated surface and have a structure shown in FIGS. 6 and 7. The ends of the blade-shaped contact members 44 on the side of the IC 22 are, as described above, in contact with the ball-shaped external terminals 25 at the four blade-shaped ridges and are made conductive with the ball-shaped external terminals 25.

on the other hand, convexities 47 are formed on the end of the blade-shaped contact members 44 on the side of the test board 23, which has such a curved surface as an almost spherical surface in contact with the upper contact end faces 43*a* of the elastic contactors 43. Furthermore, at the intermediate portion of the blade-shaped contact members 44, the flanges 35 project outward. When the blade-shaped contact members 44 come in contact with the upper contact end faces 43*a* of the elastic contactors 43 with being compressed to each other, the elastic contactors 43 begin deforming at the portions where the convexities 47 of the blade-shaped contact members 44 come in contact, thereby being made conductive with each other.

The test socket 41 has positioning members 48 with a predetermined thickness and hardness for supporting and positioning the contact member 45 at the time of test. The positioning members 48 are made of such an insulating material as a synthetic resin including epoxy resin filled with glass filler, PAI (polyamide-imide), or PES (polyether sulfide), for example.

The positioning member 48 is placed on the insulating base 42 for supporting the IC 22 and has positioning holes 49 for positioning the blade-shaped contact members 44 by being inserted in the positioning holes 49 at the time of test. The positioning holes 49 position the blade-shaped contact members 44 in the transverse direction and press the flanges 35 of the blade-shaped contact members 44 at the bottom of the positioning members 48 so as to prevent them from getting out of the positioning holes 49. The thickness of the positioning members 48 is so selected that the four blades of the blade-shaped contact members 44 are in contact with the external terminals 25 at predetermined pressure caused by the deformation of the elastic contactors 43 within the range of the elastic deformation when IC 22 is compressed downward.

At the time of the characteristic evaluation test of the IC 22 by the test socket thus constructed, the contact members 44 are put on the respective upper contact end faces 43*a* of the elastic contactors 43 berried in the insulating base 42, in such a manner that the respective convexities 47 come in contact with the respective upper contact end faces 43*a* of the elastic contactors 43. The positioning members 48 are then placed over the blade-shaped contact members 44 so that each of blade-shaped contact members 44 may be inserted into each of the positioning holes 49 and that the positioning members 48 are may be put on the flanges 35.

Then, the IC 22 is mounted in the test socket 41 so that the external terminals 25 may touch the corresponding blade-shaped contact members 44 in the positioning holes 48. Then, the test socket 41 is put on the test board 23 of the test equipment, and the IC 22 mounted in the test socket 41 is compressed by a compression mechanism of the test equipment, which is not shown in the drawing. The upper contact end faces 43*a* of the elastic contactors 43 are elastically deformed until the external terminals 25 on the bottom of the package 24 of the IC 22 touch the top of the blade-shaped contact members 44.

The lower contact end faces 43*b* are thus in contact with the contact pads 26 of the test board 23 with predetermined pressure and the external terminals 25 of the IC 22 and the corresponding contact pads 26 of the test board 23 are made conductive with each other. With the structure described, the line length of the test socket 41 becomes, for example, 1 mm or less and the inductance is 0.5 nH or less, which is the same as that of the first embodiment.

According to the present embodiment explained above, as is the case with the first embodiment, the line length of the test socket 21 can be shortened and the inductance can be lowered to less than 0.5 nH, so that the characteristics at a high frequency of several GHz can be evaluated. The blade-shaped contact members 29 are pressed to the ball-shaped external terminals 25 of the IC 22 with a long contact length of blades of the blade-shaped contact members 29 with little contact resistance.

Furthermore, with the blade-shaped contact members 44 being in contact with the external terminals 25 of through metallic blades, the contact members 29 are hardly affected by, for example, solder dust or package dust adhered to the surface of the external terminals 25 because the dust is torn off by the blades and the characteristic evaluation test can be executed satisfactorily. Even when the characteristic evaluation test is continued further, the problems in the prior art is resolved that the adhered dust is remained and piled increases contamination, which impedes a result of the characteristic evaluation test. Therefore, the necessity of cleaning is reduced remarkably, and a great deal of time for cleaning is not required.

In the second embodiment, the ends of the contact members 44 on the side of the IC 22 has blades 32 having a linear ridge to make the contact length of the external terminals 25 with the blade-shaped contact members 44 long. However, the blades may have such a curved surface as a spherical surface. Further, although the pressing portions of the contact members 44 are of the convexities 47 to make the stroke length at the contact portions of the upper contact end faces 43*a* longer, the deformed structure shown in FIGS. 12 and 13 may be used to make the stroke length shorter, inversely, by changing the compression characteristics between the blade-shaped contact members 44 and the elastic contactors 43.

Namely, in contact members 145 of a test socket 141, an end of a blade-shaped contact members 144 on the side of the test board 23 has a convexity 147 with a flat end face in contact with an upper contact end faces 43*a* of the elastic contactors 43. The flat end faces of the convexity 147 and the flat upper end surface 43*a* of the elastic contactors 43 are in contact with each other and the elastic deformation amount of the upper contact end faces 43*a* is reduced under a given compression force, and the stroke length can be shortened. Even in the deformed structure, the same effect as that of the second embodiment can be obtained.

Figure 14:
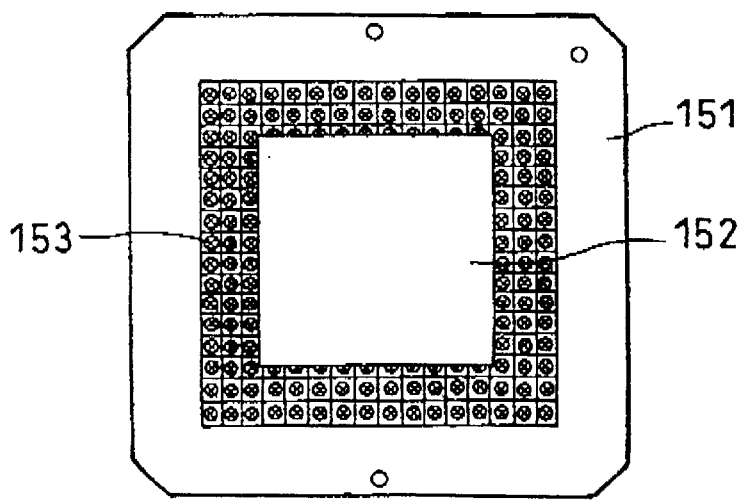
FIG. 14 is a top view of the test socket for a semiconductor device according to a third embodiment of the present invention.
Figure 15:
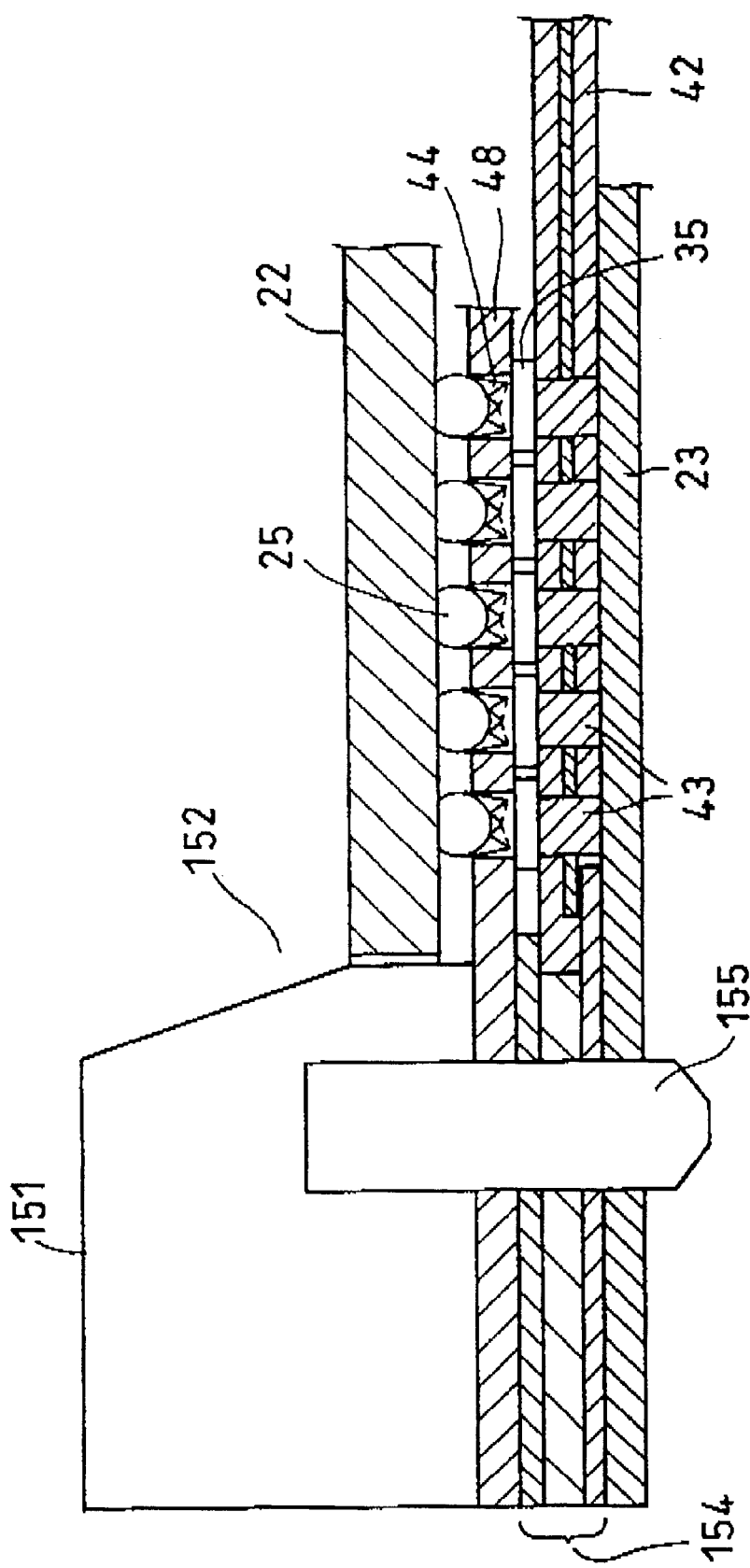
FIG. 15 is a cross sectional view showing a part of the test socket for a semiconductor device according to the third embodiment of the present invention.

FIGS. 14 and 15 are drawings of the test socket for a semiconductor device showing a third embodiment according to the present invention, wherein FIG. 14 is a top view and FIG. 15 is a cross sectional view showing a part of the test socket. In these drawings, the same numeral is assigned to each of the parts shown in FIGS. 4 to 15 and detailed explanation will be omitted. The test socket of the present invention, as shown in FIG. 14, has a square frame 151 with a concavity space 152 at the center thereof for receiving the IC 22. In a surrounding portion in the concavity space 152 of the frame 151, contact members 153 for the test socket are arranged.

The contact members 153 are composed of the positioning members 48, the blade-shaped contact members 44, the insulating base 42, and the elastic contactors 43 embedded in the insulating base 42. In the positioning members 48, in a similar manner as mentioned above, the positioning holes 49 are provided, which are arranged in a matrix form on the insulating plate. The blade-shaped contact members 44 are pressed into the positioning holes 49. At the upper ends of the blade-shaped contact members 44, in a similar manner as described above, the four blades are formed to support the external terminals 25 made of ball-shaped solder fixed to the bottom of the IC 22 at the time of test. The positioning holes 49 of the positioning members 48 position the blade-shaped contact members 44 in the transverse direction and press the flanges 35 of the blade-shaped contact members 44 by the bottom surface of the positioning members 48 so as to prevent them from getting out of the holes. The thickness of the positioning members 48 is so selected that the four blades of the blade-shaped contact members 44 are in contact with the external terminals 25 at predetermined pressure caused by the deformation of the elastic contactors 43 within the range of the elastic deformation when IC 22 is compressed downward.

At the time of the characteristic evaluation test of the IC 22 by the test socket thus constructed, the contact members 44 are put on the respective upper contact end faces 43*a* of the elastic contactors 43 berried in the insulating base 42, in such a manner that the respective convexities 47 come in contact with the respective upper contact end faces 43*a* of the elastic contactors 43. The positioning members 48 are then placed over the blade-shaped contact members 44 so that each of blade-shaped contact members 44 may be inserted into each of the positioning holes 49 and that the positioning members 48 are may be put on the flanges 35.

Then, the IC 22 is mounted in the test socket 41 so that the external terminals 25 may touch the corresponding blade-shaped contact members 44 in the positioning holes 48. Then, the test socket 41 is put on the test board 23 of the test equipment, and the IC 22 mounted in the test socket 41 is compressed by a compression mechanism of the test equipment, which is not shown in the drawing. The upper contact end faces 43*a* of the elastic contactors 43 are elastically deformed until the external terminals 25 on the bottom of the package 24 of the IC 22 touch the top of the blade-shaped contact members 44.

The lower contact end faces 43*b* are thus in contact with the contact pads 265 of the test board 23 with predetermined pressure and the external terminals 25 of the IC 22 and the corresponding contact pads 26 of the test board 23 are made conductive with each other. With the structure described, the line length of the test socket 41 becomes, for example, 1 mm or less and the inductance is 0.5 nH or less, which is the same as that of the first embodiment.

As shown in FIG. 15, the test board 23, the insulating base 42, and the positioning members 48 are laminated properly interposing spacers 154 and finally the frame 151 is laminated on them. Positioning pins 155 are inserted from the bottom of the frame 151 passing through the test board 23, the insulating base 42, the positioning members 48 and the spacer 154. With the positioning pins 155, the external terminals 25, the positioning members 48, the insulating base 42, and the test board 23 of the IC 22 are aligned in their mutual positions.

It is well understood from the description above that, according to the present invention, high frequency characteristics can be satisfactorily evaluated, even when the characteristic evaluation test is repeatedly executed, since the test socket is hardly contaminated. It is also understood that the cleaning of the test socket does not require a great deal of time, which means that the maintenance and handling of the test socket is easy.

What is claimed is:

1. A test socket for a semiconductor device having contact members which lie between ball-shaped external terminals projected from a surface of the semiconductor device and contact pads of the semiconductor test circuit to make them conductive to each other, wherein each of said contact member comprises:

blade-shaped contact members in contact with one of said external terminals;

a positioning member for positioning said blade-shaped contact members having positioning holes into which said blade-shaped contact members are inserted, and a conductive elastic contactor having a top portion which is in contact with said blade-shaped contact member positioned by said positioning member and a bottom portion of which is in contact with one of said contact pads.

2. A test socket for a semiconductor device claimed in claim 1, wherein said blade-shaped contact members have a plurality of blades arranged so that their outer surfaces form a circular surface and that ridgelines of the blades become gradually low from the outer peripheral surfaces of the circular arrangement toward the center thereof and intersect each other at a bottom part.

3. A test socket for a semiconductor device claimed in claim 2, wherein said blade-shaped contact member has a flange formed at its bottom which engages a lower surface of the positioning member and prevents the blade-shaped contact member from being get out of the positioning holes upward, when they are inserted into the positioning holes of the positioning members.

4. A test socket for a semiconductor device claimed in claim 3, wherein said blade-shaped contact member has a substantially flat bottom surface, which is in contact with a top of the elastic contactors.

5. A test socket for a semiconductor device claimed in claim 4, wherein said blade-shaped contact members are installed so as to be removable from the elastic contactors.

6. A test socket for a semiconductor device claimed in claim 5, wherein said elastic contactors are made of a conductive resin and are embedded in an insulating base at a predetermined pitch.

7. A test socket for a semiconductor device claimed in claim 6, wherein said insulating base supports the elastic contactors so that both ends thereof are projected from upper and lower surfaces of the insulating base.

8. A test socket for a semiconductor device claimed in claim 7, wherein said positioning members having the positioning openings position the contact members and elastic contactors for the external terminals and contact pads.

9. A test socket for a semiconductor device claimed in claim 7, wherein said positioning pins are fixed to the frame plate passing through said positioning member, said insulating base, and said boards on which said semiconductor test circuit are formed.

10. A test socket for a semiconductor device claimed in claim 3, wherein either one of said bottom of the blade-shaped contact member or said top of the elastic contactor has either one of a convexity and concavity so that they are fit into each other.

11. A test socket for a semiconductor device having contact members which lie between a plurality of ball-shaped external terminals projected from a surface of the semiconductor device and contact pads of the semiconductor test circuit to make them conductive to each other, wherein each of said contact member comprises:

blade-shaped contact members in contact with one of said external terminals, a positioning member for holding the blade-shaped contact members, and a plurality of conductive elastic contactors having a top portion which is in contact with one of said blade-shaped contact members positioned by said positioning member and a bottom portion of which is in contact with one of said contact pads.

12. A test socket for a semiconductor device claimed in claim 11, wherein said blade-shaped contact members have a plurality of blades arranged so that their outer surfaces form a circular surface and that ridgelines of the blades become gradually low from the outer peripheral surfaces of the circular arrangement toward the center thereof and intersect each other at a bottom part.

13. A test socket for a semiconductor device claimed in claim 12, wherein a plurality of positioning holes are formed in the positioning members and the blade-shaped contact member has a flange formed at its bottom which engages a lower surface of the positioning member and prevents the blade-shaped contact member from being get out of the positioning holes upward, when they are inserted into the positioning holes of the positioning members.

14. A test socket for a semiconductor device claimed in claim 13, wherein said blade-shaped contact member has a substantially flat bottom surface, which is in contact with a top of the elastic contactors.

15. A test socket for a semiconductor device claimed in claim 14, wherein said elastic contactors are made of a conductive resin and are embedded in an insulating base at a predetermined pitch.

16. A test socket for a semiconductor device comprising:

a frame plate having a space for housing the semiconductor device at a center portion thereof;

a positioning member in contact with a bottom surface of the frame plate which is arranged so that a part of an upper surface thereof is exposed in the space for housing the semiconductor device;

a plurality of blade-shaped contact members fixedly received in a plurality of positioning holes formed in the positioning member;

an insulating base arranged so as to be in contact with a bottom surface of the positioning member;

a plurality of elastic contactors embedded in an insulating base at a predetermined pitch; and a board arranged in contact with a bottom surface of the insulating base on which the semiconductor test circuit is formed.

* * * * *